April 6, 1954 N. LUND 2,674,720
FREQUENCY CONTROL CIRCUIT
Filed July 16, 1952
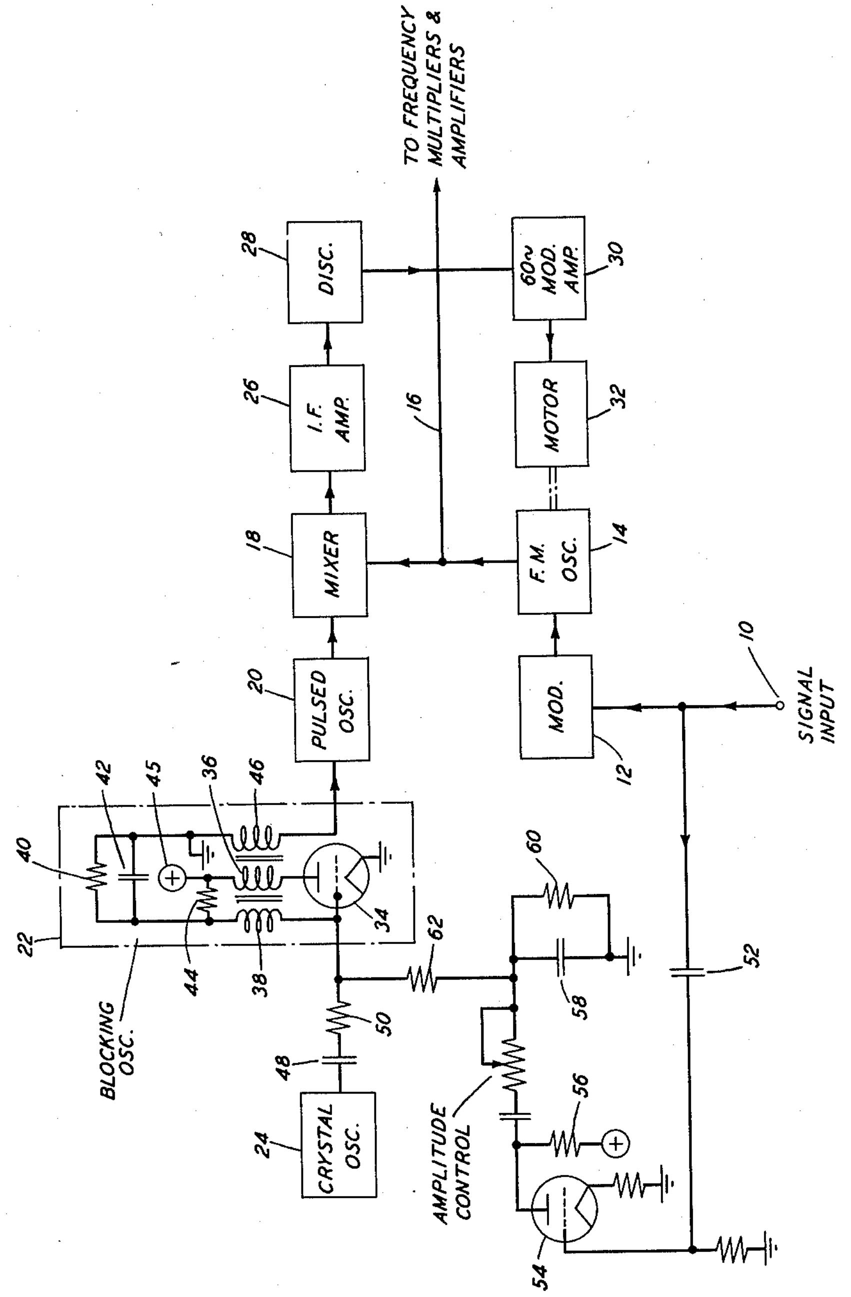
INVENTOR
N. LUND
BY George C. Lord
ATTORNEY Patented Apr. 6, 1954 2,674,720

UNITED STATES PATENT OFFICE 2,674,720

FREQUENCY CONTROL CIRCUIT

Nean Lund, Plainfield, N. J., assignor to Bell Telephone Laboratories, Incorporated, New York, N. Y., a corporation of New York Application July 16, 1952, Serial No. 299,289

2 Claims. (Cl. 332—19)

This invention relates to automatic frequency control systems and more particularly to improvements in automatic frequency control circuits for oscillators employed for frequency modulation transmitters.

Although many automatic frequency control systems have been devised and a considerable number of these are suitable for use with oscillators for frequency modulation systems, most, if not all such circuits are arranged to hold the oscillator frequency at a particular single value and are not suitable for use where the oscillator must be tuned to any one of a very large number of frequencies and thereafter maintained accurately at the chosen frequency.

In one automatic frequency control system which has been proposed for use in communication equipment in which it is desirable to maintain accurately the frequency of a transmitter oscillator at any one of a large number of different frequencies there is provided a circuit in which the output of the oscillator to be controlled is combined with the output of a second, manually tunable, oscillator which is pulsed at an accurately maintained repetition rate under the control of a crystal oscillator. The output of such a pulsed oscillator comprises a series of discrete frequencies which are harmonics of the pulse repetition rate determined by the crystal oscillator. The output of the mixer in which the outputs of the two oscillators are combined comprises a spectrum of harmonically related beat frequencies. This output is applied to a selective amplifier which is arranged to pass only one of these beat frequencies and thence to a conventional discriminator circuit, the center frequency of which is chosen at the center of the pass band of the selective amplifier. When the signal at the mixer output is of this chosen center frequency no discriminator output is obtained. Under all other circumstances an output is obtained from the discriminator and may be employed as an error signal to control the tuning of the main oscillator.

Automatic frequency control circuits of this type however suffer from a disadvantage in that one of the two inputs to the mixer is the output of the main oscillator and accordingly is frequency modulated. Under these circumstances the modulation sidebands of the individual harmonic frequencies appearing at the output of the mixer may overlap, thereby preventing the selective amplifier from isolating the desired beat frequency and rendering the control loop unstable.

It is the object of the present invention to provide an automatic frequency control circuit of the type employing a pulsed oscillator in which the deleterious effects of frequency modulation of the output of the controlled oscillator are eliminated without the necessity of adding complex and expensive auxiliary circuits to the equipment.

In accordance with the invention there is provided in an automatic frequency control circuit for the main oscillator of a frequency modulated transmitter an auxiliary oscillator which is pulsed to obtain a pulse spectrum which is in turn beat with the output of the main oscillator. The beat signal is applied through a selective amplifier to a discriminator circuit from which a control voltage is derived for mechanical tuning means associated with the main oscillator. The effect of frequency modulation of the main oscillator output is avoided by frequency modulating the output of the pulsed oscillator by the same wave by which the output of the main oscillator is modulated and in phase therewith. The resulting frequency modulations of the input signals applied to the beating mixer circuit therefore cancel with the result that the control signal is free of the adverse effects referred to above.

The above and other features of the invention will be described in the following detailed specification taken in connection with the drawing, the single figure of which is a schematic diagram, partly in block form, of an automatic frequency control circuit according to the invention.

As shown in the drawing the oscillator to be controlled forms a part of the transmitter of a communication system. Thus a modulating message wave signal applied at terminal 10 acts through a modulator 12 to frequency modulate the output of a transmitting oscillator 14. The frequency modulated output of oscillator 14 is applied over a lead 16 to suitable frequency multipliers and radio frequency amplifiers to increase the frequency and amplitude of the oscillator output to values suitable for radiation.

It is desired to tune the nominal frequency of oscillator 14 to any one of a relatively large number of different values and to maintain the nominal frequency accurately at the chosen value. To this end a portion of the output of the oscillator is applied to a mixer circuit 18 to which is also applied the output of a variable frequency auxiliary oscillator 20. A blocking oscillator 22 is arranged to pulse oscillator 20 at a fixed repetition rate and in such a way that the output of oscillator 20 comprises a spectrum of discrete frequencies which are harmonics of the pulse repetition rate, this spectrum being centered upon the nominal operating frequency of the auxiliary oscillator 20. While oscillator 20 may be of any desired type having suitable characteristics, it has been found that an oscillator of the Colpitts type in which the pulse input is applied to the control grid of the oscillator tube is suitable for this purpose.

The repetition rate of the blocking oscillator is precisely controlled by a high stability crystal oscillator 24 of conventional type. In this arrangement a crystal tuned circuit forming a part of oscillator 24 serves accurately to determine the whole spectrum of harmonic frequencies appearing at the output of pulsed oscillator 20. Of these harmonic frequencies, those nearest the nominal frequency to which the pulsed oscillator is tuned are of the greatest amplitude. Thus the particular harmonics having the greatest amplitudes depend upon the frequency to which the auxiliary oscillator is tuned but the accuracy with which these frequencies are maintained depends upon the stability of the crystal oscillator 24.

It is desired to choose one of the harmonics produced by the auxiliary oscillator for control of transmitter oscillator 14. For this purpose the output of the mixer is applied to a selective amplifier 26, the pass band of which is so chosen as to permit transmission of a single one of the harmonic frequency outputs of the mixer (and to some extent the side bands associated therewith as a result of frequency modulation of the output of oscillator 14) and to discriminate against the other harmonic frequency components and the corresponding side bands. The output of this selective amplifier is applied to a balanced discriminator 28 of conventional type, the center or balance frequency of which is set at the center of the pass band of the selective amplifier. Thus if pulsed oscillator 20 is tuned to a frequency removed from the desired operating frequency of transmitting oscillator 14 by the center frequency of discriminator 28, the transmitting oscillator 14 must be tuned to the desired frequency to prevent the production of an output by discriminator 28. Under all other circumstances the output of discriminator 28 will be a direct current voltage of polarity determined by the sense in which the frequency of the transmitting oscillator departs from the desired frequency and of amplitude determined by the extent of the excursion of the frequency of the transmitting oscillator from that frequency.

This direct current output obtained from the discriminator obviously may be employed as an error signal to control the tuning of the transmitting oscillator thereby to provide an automatic frequency control circuit. In one convenient arrangement the varying direct current from the discriminator 28 is applied as a modulating wave to a balanced modulator 30, the carrier input to which is a low frequency (for example, 60 cycle) alternating current wave. The output of the balanced modulator may then be employed to energize the shading winding of a conventional shaded pole motor 32 to control the direction and extent of rotation of the tuning element of transmitting oscillator 14.

This type of automatic frequency control circuit performs satisfactorily in the absence of modulation of the output of the transmitting oscillator at high deviation ratios. However, when the transmitting oscillator is so modulated, the resultant frequency modulation of the spectrum appearing at the output of mixer 18 may be such as to cause overlapping of the modulation sidebands associated with harmonics other than the desired harmonic in the signal applied to selective amplifier 26. As a result the selective circuits thereof are unable to discriminate between the harmonic required for control of the transmitting oscillator and adjacent harmonics. Then the automatic frequency control circuit becomes unstable and either fails to perform at all or performs with a low and variable degree of accuracy.

To avoid these undesirable effects of frequency modulation of the oscillator and according to the invention, a portion of the modulating input signal appearing at terminal 10 is employed to frequency modulate the pulse spectrum appearing at the output of pulsed oscillator 20. Although this result may be obtained in a variety of ways it is convenient to employ this input signal to frequency modulate the pulse output of blocking oscillator 22. One circuit for accomplishing this result is indicated in the drawing in which blocking oscillator 22 is shown in detail as comprising a triode type tube 34, the cathode of which is grounded and the anode of which is connected through the primary winding 36 of a coupling transformer to a source of potential which is positive with respect to ground as indicated at terminal 45. The control grid of the triode 34 is connected to ground through winding 38 of the coupling transformer and through a grid leak comprising resistor 40 and capacitor 42 connected in parallel. A bias voltage is applied to the control grid from the terminal 45 through resistor 44 which with resistor 40 serves as a voltage divider connected between the positive terminal of the source of potential and ground. The coupling transformer is provided with a third winding 46 which serves as an output circuit for the blocking oscillator. It will be recognized that blocking oscillator 22 as described above is of conventional type and operates to produce a series of pulses at a natural repetition rate determined by the constants of the oscillator circuit. Operation of blocking oscillator 22 may be synchronized with the output from crystal oscillator 24 by the application of that output to the control grid of tube 34 through a coupling circuit comprising capacitor 48 and series resistor 50. Any variation in the frequency of the signal applied to the control grid of blocking oscillator tube 34 causes phase modulation of the pulse output.

In accordance with the invention therefore, the modulating signal from terminal 10 is applied through a coupling capacitor 52 to the control grid of a conventional triode amplifier stage 54 and the amplified output is employed to modulate the output of the blocking oscillator. Since, however, effective frequency modulation of the output of pulse oscillator 20 is desired, the modulating signal for the blocking oscillator appearing across output resistor 56 of amplifier 54 is applied through a coupling circuit to a de-emphasis network comprising capacitor 58 and shunt resistor 60 connected between the output of the coupling circuit and ground. As a result, the output from amplifier 54 undergoes a phase shift of 90 degrees and as applied through resistor 62 to the control grid of the blocking oscillator is of proper character to produce the desired frequency modulation of the output of pulsed oscillator 20.

As a result of the modulation of the output from blocking oscillator 22 the output of pulsed oscillator 20 may, if the relative amplitudes are properly adjusted, be frequency modulated in the same sense and to the same extent as the output of transmitting oscillator 14. Under these conditions the beating action in mixer circuit 18 can result in substantially complete cancellation of the frequency modulation since either the sum or difference of two inputs both frequency modulated to the same extent and in phase is independent of such modulation. It follows that the output of the mixer comprises only the unmodulated spectrum of harmonically related control frequencies desired for control purposes in the automatic frequency control circuit.

What is claimed is:

1. In an automatic frequency control circuit for a frequency modulation transmitter oscillator, an auxiliary oscillator tunable to a frequency related to that desired for said transmitter oscillator, a blocking oscillator arranged to pulse said auxiliary oscillator at a fixed repetition rate, a mixer combining the outputs of the pulsed auxiliary and transmitter oscillators, means for deriving a control signal from said combined output for application to control the frequency of said transmitter oscillator, means for deriving an amplified sample of the modulating signal for said transmitter oscillator, and means for introducing a 90 degree phase shift in said sample and applying said sample to modulate the output of said blocking oscillator.

2. In an automatic frequency control circuit for a frequency modulation transmitter oscillator, an auxiliary oscillator tunable to a frequency related to that desired for said transmitter oscillator, a blocking oscillator arranged to pulse said auxiliary oscillator at a fixed repetition rate, a mixer combining the outputs of the pulsed auxiliary and transmitter oscillators, means for deriving a control signal from said combined output for application to control the frequency of said transmitter oscillator and means for deriving a sample of the modulating signal for said transmitter oscillator and applying said sample to phase modulate the output of said blocking oscillator, said means including a buffer amplifier and a resistance-capacitance de-emphasis circuit arranged to introduce a 90 degree phase shift in said signal sample prior to application thereof to said blocking oscillator.

References Cited in the file of this patent

UNITED STATES PATENTS

| Number | Name | Date |
|---|---|---|
| 2,591,257 | Hershberger | Apr. 1, 1952 |